United States Patent
Lazar et al.

(10) Patent No.: US 9,732,417 B2
(45) Date of Patent: Aug. 15, 2017

(54) ARRAY OF METALLIC NANOTUBES

(75) Inventors: Florica Lazar, Villeurbanne (FR);
Arnaud Morin, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 734 days.

(21) Appl. No.: 14/007,859

(22) PCT Filed: Mar. 29, 2012

(86) PCT No.: PCT/FR2012/000118
§ 371 (c)(1),
(2), (4) Date: Sep. 26, 2013

(87) PCT Pub. No.: WO2012/131194
PCT Pub. Date: Oct. 4, 2012

(65) Prior Publication Data
US 2014/0015159 A1    Jan. 16, 2014

(30) Foreign Application Priority Data
Mar. 29, 2011   (FR) ..................... 11 00923

(51) Int. Cl.
| | | |
|---|---|---|
| C23C 16/01 | (2006.01) | |
| B82Y 30/00 | (2011.01) | |
| C30B 25/00 | (2006.01) | |
| C30B 25/18 | (2006.01) | |
| C30B 29/02 | (2006.01) | |
| C30B 29/60 | (2006.01) | |

(Continued)

(52) U.S. Cl.
CPC .............. *C23C 16/01* (2013.01); *B82Y 30/00* (2013.01); *C23C 16/045* (2013.01); *C23C 16/06* (2013.01); *C30B 25/00* (2013.01); *C30B 25/18* (2013.01); *C30B 29/02* (2013.01); *C30B 29/602* (2013.01)

(58) Field of Classification Search
CPC ....... B82Y 30/00; C23C 16/01; C23C 16/045; C23C 16/06; C23C 18/42; C30B 25/00; C30B 25/18; C30B 29/02; C30B 29/602
See application file for complete search history.

(56) References Cited

U.S. PATENT DOCUMENTS

| | | |
|---|---|---|
| 2004/0175844 A1 | 9/2004 | Yang et al. |
| 2004/0262636 A1* | 12/2004 | Yang ..................... B82Y 10/00 257/200 |
| 2005/0056118 A1 | 3/2005 | Xia et al. |

(Continued)

OTHER PUBLICATIONS

Synthesis of Cu Nanotubes with Silicon Oxide Nanowire Templates by MOCVD, Wang et al., Electrochemical and Solid-Stale lellers, 8 (1) C9-C 11 (2005).*

(Continued)

*Primary Examiner* — Michael Kornakov
*Assistant Examiner* — Hua Qi
(74) *Attorney, Agent, or Firm* — Oliff PLC

(57) ABSTRACT

A method for producing an array or bed of metallic nanotubes includes formation of nanowires made from sacrificial material on a growth support, deposition of a metal layer on the nanowires so as to form metallic nanotubes concentric with the nanowires, deposition of a polymer binding layer between the nanowires, elimination of the support, the binding layer supporting the metallic nanotubes, and etching of the sacrificial material.

17 Claims, 3 Drawing Sheets

(51) Int. Cl.
*C23C 16/04* (2006.01)
*C23C 16/06* (2006.01)

(56) References Cited

U.S. PATENT DOCUMENTS

| | | | |
|---|---|---|---|
| 2006/0289351 A1 | 12/2006 | Xiao et al. | |
| 2007/0202673 A1 | 8/2007 | Kim et al. | |
| 2009/0042089 A1* | 2/2009 | Choi | H01M 4/8663 |
| | | | 429/442 |
| 2009/0043330 A1* | 2/2009 | To | A61F 2/07 |
| | | | 606/194 |

OTHER PUBLICATIONS

Wang, J. H. et al. "Synthesis of Cu nanotubes with silicon oxide nanowire templates by MOCVD", *Electrochemical and Solid-State Letters*, 2005, vol. 8, No. 1, pp. C9-C11.

Hua et al. "Metal nanotubes prepared by a sol-gel method followed by a hydrogen reduction procedure", *Nanotechnology*, 2006, vol. 17, pp. 5106-5110.

Fu et al, "Electroplating of metal nanotubes and nanowires in a high aspect-ratio nanotemplate", *Electrochemistry Communications*, 2008, vol. 10, pp. 514-518.

Alexe et al. "Ferroelectric nanotubes fabricated using nanowires as positive templates", *Applied Physics Letters*, 2006, vol. 89, pp. 172907-172907-3.

* cited by examiner

ARRAY OF METALLIC NANOTUBES

BACKGROUND OF THE INVENTION

The invention relates to a method for producing an array or bed of metallic nanotubes, and more particularly of nanotubes made from noble metal.

STATE OF THE ART

Metallic nanotubes can be used in a large number of applications, such as energy conversion, catalysis or detection of gas. Nanotubes made from noble metals (Pt, Au, Ir, Pd, etc.) are particularly interesting on account of their high electric conductivity, their oxidation resistance and their catalytic properties. What is meant by nanotube is a structure having the shape of a hollow cylinder with a diameter of less than 1 μm.

A conventional technique for producing metallic nanotubes consists in covering the inner walls of a porous support, also called template, with metal. The porous template is then eliminated to release the metallic nanotubes. The metal can be deposited on the walls of the pores in different manners.

American Patent application U.S.2006/0289351 describes a method for producing bismuth nanotubes from an aluminium oxide (alumina) membrane. The membrane is made porous by means of an anodizing treatment. A plurality of longitudinal pores of identical shape and dimensions is thus created. The membrane is covered by a layer of bismuth, and then heated to make the metal melt. The bismuth enters the pores of the membrane and covers the walls to form nanotubes. This deposition technique by wetting is limited to metals having a low melting temperature.

In the article ["Metal nanotubes prepared by a sol-gel method followed by a hydrogen reduction procedure", Hua et al., Nanotechnology 17, p.5106-5110, 2006], the porous template is impregnated with a paste (sol) containing a solvent, a coordination agent and metallic salts. Heat treatment is applied to evaporate the solvent, thereby forming metal oxide nanotubes in the pores of the template. Finally, a hydrogen reduction reaction converts the oxide into metal.

The article ["Electroplating of metal nanotubes and nanowires in a high aspect-ratio nanotemplate", Fu et al., Electrochemistry Communications 10, p.514-518, 2008] describes deposition of platinum by electrodeposition. Gold is sprayed onto a porous alumina membrane so as to form a work electrode when electrodeposition is performed. The platinum is deposited on the gold, and then along the walls of the pores.

The use of a porous template implies large dimensional constraints on the nanotubes. For example, the diameter of the cylindrical pores of the template, and therefore the diameter of the nanotubes, is difficult to control. Furthermore, the template having been eliminated, the nanotubes obtained are individualized and cannot form a bed of nanotubes. Finally, these methods are cumbersome to implement and have to be adapted for each change of metal. It is therefore difficult to define a simple and universal method.

The document "Ferroelectric nanotubes fabricated using nanowires as positive templates" (M. Alexe et al., Applied Physics letters 89, 172907, 2006) describes another technique for forming metallic nanotubes. Silicon nanowires are first formed on a growth substrate and then covered with platinum and a ferroelectric metal to form multilayer nanotubes. These metals are respectively deposited by magnetron sputtering and by pulsed laser deposition (PLD).

The silicon of the nanowires is then etched in a solution of potassium hydroxide (KOH) to release the nanotubes. The nanotubes are then separated from the growth substrate, and then transferred one by one onto another silicon substrate covered with platinum, by means of a nano-handler.

As previously, this technique does not enable an array of nanotubes, organized with respect to one another and oriented in the same manner, to be obtained in the form of a bed of nanotubes.

SUMMARY OF THE INVENTION

A need therefore exists for a method for producing an organized array of metallic nanotubes that is easy to implement and enables the dimensional constraints on the nanotubes to be relaxed.

This needs tends to be satisfied by providing nanowires made from sacrificial material on a support, depositing a metal layer on the nanowires so as to form metallic nanotubes concentric with the nanowires, depositing a binding layer made from polymer material on the support, eliminating the support, the binding layer supporting the metallic nanotubes, and eliminating the sacrificial material.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

Rather than impregnating the cylindrical pores of a template with metal, metallic nanotubes are formed by depositing the metal on nanowires made from sacrificial material. The nanowires, acting as template, thus define the arrangement and dimensions of the nanotubes. The sacrificial material is then etched to form the inner cavity of the nanotubes.

Figure 1:
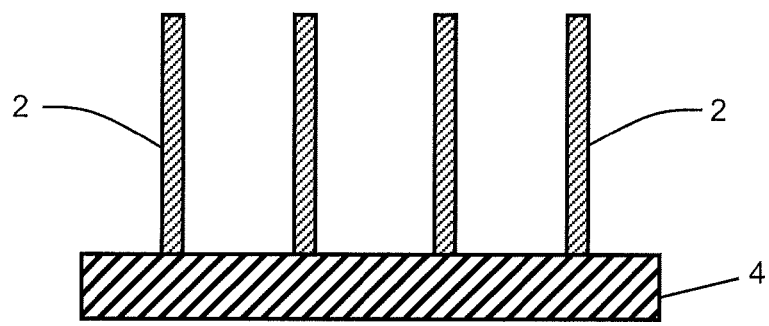
FIGS. 1 to 3 represent steps of an embodiment of a method for producing metallic nanotubes from silicon nanowires.
Figure 2:
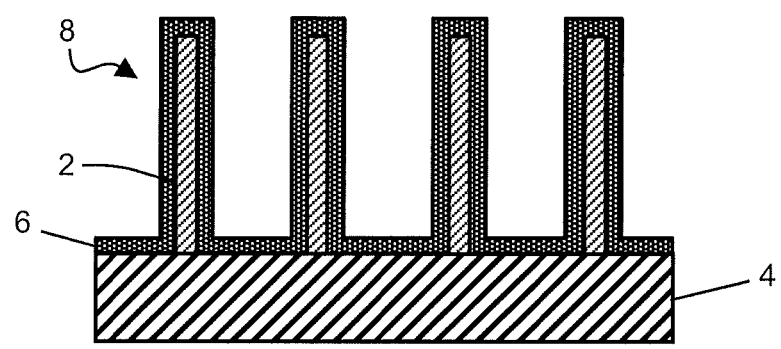
Figure 3:
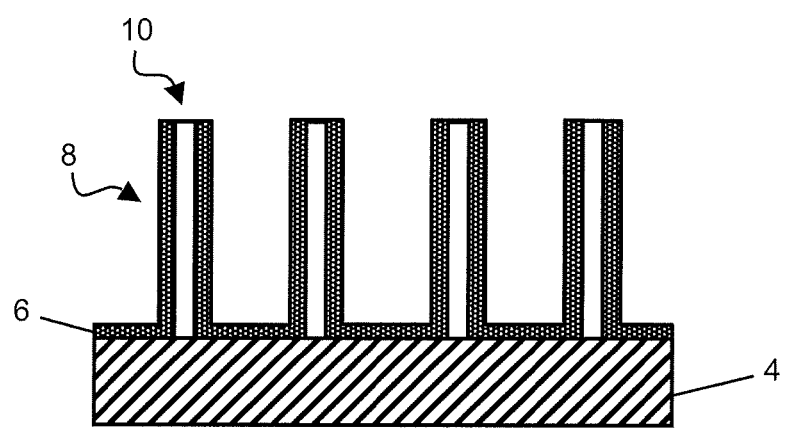

FIGS. 1 to 3 represent generic steps of a method for producing metallic nanotubes.

In FIG. 1, silicon nanowires 2 are formed on a substrate 4. Nanowires 2 are preferably formed by the VAS (vapor-liquid-solid) growth technique. This technique consists in bringing silicon in gaseous form (silane) close to a liquid catalyst located on the growth substrate in the form of drops (gold colloids for example). The silicon then precipitates in solid phase in contact with the catalyst to form nanowires with a diameter equal to that of the drops. Alternatively, the silicon nanowires can be formed by anisotropic etching of a silicon substrate or by chemical vapor deposition (CVD).

The nanowires have a diameter comprised between 10 nm and 50 μm, preferably between 100 nm and 1 μm. The length of the nanowires varies between 5.5 μm and 30 μm. Growth support 4 can be made from silicon, metal, glass or any other material suitable for growth of nanowires by the VLS technique.

FIG. 2 represents deposition of a metal layer 6 on nanowires 2, and optionally on growth substrate 4. Layer 6 is preferably deposited in conformal manner so as to reproduce the shape of the nanowires. Metallic tubes 8 are thus formed, each tube comprising a nanowire 2 in its center.

Layer 6 can be deposited by a chemical process, and more particularly by chemical vapor deposition from organometallic precursors (MOCVD, Metal-Organic Chemical Vapor Deposition). By means of this technique, the deposition is constituted by agglomerated metal nanoparticles and presents a porous aspect. In a device of catalyst or electrochemical reactor type, this porous layer enables a better use of the metal, as the contact surface with the reagents is increased.

Deposition of layer 6 can also be performed by a hybrid CVD deposition technique called Atomic Layer Deposition (ALD), which enables conformal and dense depositions to be obtained, by evaporation (Joule effect gun, e-beam, etc.) or by cathode sputtering. Metal layer 6 is then continuous and covers the whole substrate. Deposition can also be performed by chemical reduction of a metallic salt. When nanowires 2 are made from doped semi-conductor material, they have a metallic behaviour and layer 6 can be formed by electrodeposition.

The thickness of layer 6 is preferably comprised between 2 nm and 20 nm, which corresponds to the thickness of the walls of nanotubes 8. The metal is preferably chosen from noble metals (platinum, gold, silver, iridium, palladium, etc.) or their alloys.

The step of FIG. 3 corresponds to elimination of the silicon nanowires by chemical etching. Tubes 8, i.e. the nanowires covered by layer 6, can be opened at one end at least. In the example of FIG. 3, the etching solution reaches the silicon after the free ends 10 of the tubes, i.e. the ends opposite the substrate, have been opened. This opening is preferably performed by chemical mechanical polishing, which enables the length of all the nanotubes technique to be equalized.

The etching solution can also reach the silicon by passing through the walls of nanotubes 8 when the walls are porous. The step of opening the ends is then optional.

In the case of silicon, the etching solution conventionally comprises potassium hydroxide (KOH), a mixture of hydrofluoric acid (HF), nitric acid (HNO3) and acetic acid (CH3COOH), a mixture of HF and ammonium fluoride (NH4F) or tetramethylammonium hydroxide (TMAH).

To perform this etching, it is preferable to pour the chemical solution onto the nanowire substrate drop after drop, instead of immersing the substrate in an etching bath. Furthermore, the solution is heated to a temperature close to that of the substrate. Thermal shocks, which would be detrimental for the nanotubes, are thus avoided. The solution and substrate are for example heated to a temperature comprised between 35° C. and 60° C.

Figure 4:
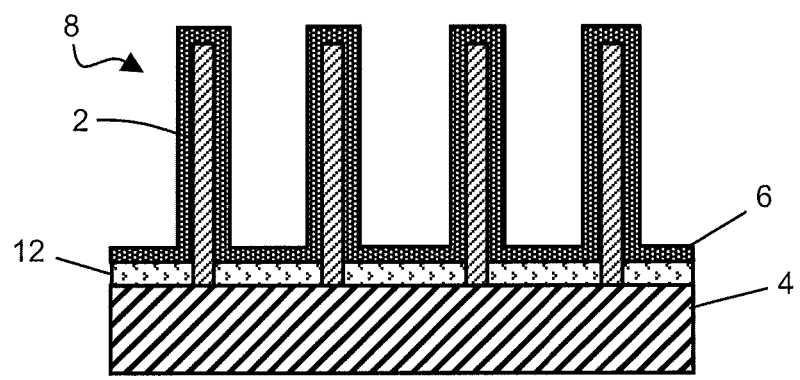
FIGS. 4 and 5 represent additional steps of the method for producing metallic nanotubes, respectively deposition of a polymer layer and removal of the growth substrate of the nanowires.
Figure 5:
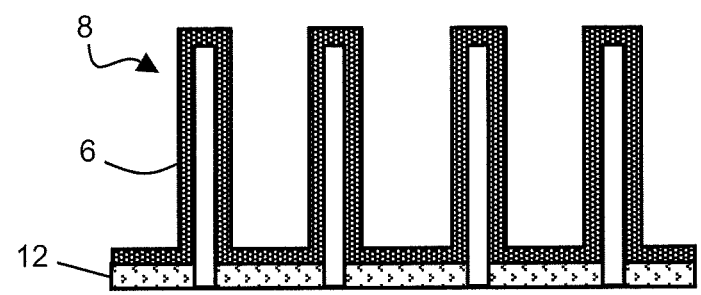

FIGS. 4 and 5 represent steps of an alternative embodiment of the method in which a binding layer, for example made from polymer or ceramic, constitutes the mechanical support between the nanotubes, instead of the growth support.

In FIG. 4, a layer 12 is deposited on growth support 4, before deposition of metal layer 6 (FIG. 2). The thickness of layer 12 is preferably smaller than that of nanowires 2, between 5 μm and 25 μm.

The material of layer 12 is chosen from materials resistant to the nanowire etching step and to the metallic deposition method, in particular to the MOCVD deposition temperature. What is meant by resistant material is a material which keeps its integrity, i.e. its chemical and physical structure without any loss or gain of material, after a technological step.

In the case of a ceramic material, material 12 can be alumina or a glass.

In the case of a polymer, material 12 is for example chosen from polyamides, fluorinated polymers (PVDF, HFP), perfluorinated polymers (PTFE), perfluorosulfonated polymers (Nafion®, Aquivion™), polyvinylpyrrolidone (PVP), polyimides (Kapton), cetone polyarylethers, polyarylethersulfonates, polybenzimidazoles and their copolymers.

Polymer layer 12 is preferably deposited by spin-coating. It can also be envisaged to deposit a polymer in solution in one or more solvents, and to then perform heat treatment to evaporate the solvents.

Several embodiments of polymer layer 12 are described in the following in preferential cases of fluorinated, perfluorinated and perfluorosulfonated polymers.

Fluorinated polymers are polymers containing at least one C—F group in their repetition pattern, or monomer unit. Polyvinylidene fluoride (PVDF) or polyvinylidene fluoride-co-hexafluoropropene (PVDF-HFP) can in particular be used. Layer 12 is produced from these polymers in solution in one or more solvents chosen from dimethyl acetamide (DMAC), dimethylformamide (DMF), dimethylsulfoxide (DMSO) and N-methylpyrrollidone (NMP). The solvents are then evaporated by heat treatment.

With this type of polymers, precautions have to be taken as far as subsequent etchings of the support and of the sacrificial material are concerned. Indeed, as monomer units of the VDF type are sensitive to alkalis, it is preferable to use acid etching solutions.

Perfluorinated polymers are polymers not containing any C—H groups but a majority of C—F2 groups in their repetition pattern. Polytetrafluoroethylene, or PTFE, is the most common in this category. Polymers originating from monomers containing groups of tetrafluoroethylene (TFE), hexafluoropropene (HFP), perfluoroalcoxy (PFA), or chlorotrifluoroethylene (CTFE) type, and their copolymers, can also be used. These polymers are resistant to acids and to alkalis.

Unlike fluorinated polymers, perfluorinated polymers are not soluble. To be shaped, the monomers are polymerized in suspension, in the same manner as PTFE, or by a melt method. Implementation from a suspension solution is however delicate in so far as it is very liquid. A sintering step is subsequently performed at a temperature comprised between 120° C. and 200° C.

Perfluorosulfonated polymers present the advantage of being available in suspension in a mixture of water and alcohol, or even in an aqueous suspension (water only). A solution containing between 4% and 25% mass of monomer in the suspension is preferably used. To produce the polymer layer, it is advantageous to add a proportion of solvent of DMF, DMAc or DMSO type equal to the volume of polymer to the initial water/alcohol suspension solution. The use of these solvents facilitates shaping and enables a layer with better mechanical properties to be obtained. Furthermore, it is also advantageous to exchange the ionomer (which is in protonated form) with a counter-ion of Na+ or Li+ type, or even a divalent ion (Cu2+) after removal of the support. This type of ion enables the mechanical stability of the ionomer to be improved.

Fluorinated, perfluorinated and perfluorosulfonated polymers are preferred as they are stable with respect to the oxidation reaction which takes place in the sacrificial material elimination step and the support etching step, described below in relation with FIG. 5.

Access for etching the silicon of the nanowires can be achieved by eliminating the top part of layer 6, as was described in relation with FIG. 3. Layer 12 does however perform support of the nanotubes. It is therefore possible to achieve this access on the other side of the nanowires, by removing growth substrate 4.

FIG. 5 represents the growth support removal step. This removal can be achieved by etching or by chemical mechanical polishing depending on the nature of the substrate and its thickness, before etching of the nanowires. In the case of a silicon substrate, removal of the substrate is preferably performed at the same time as elimination of the nanowires.

Figure 6:
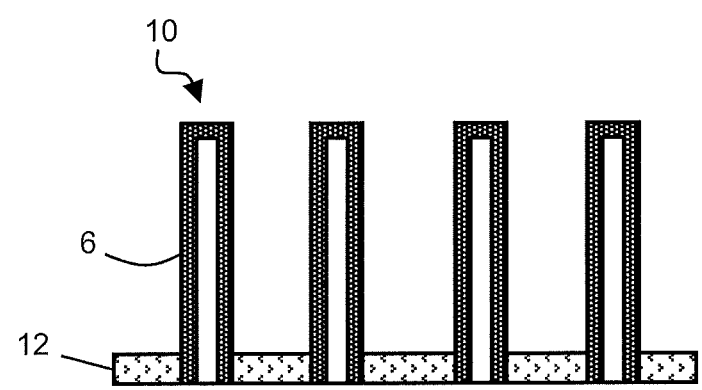
FIG. 6 represents an alternative embodiment of the step of depositing the polymer layer of FIG. 4.

FIG. 6 represents an alternative embodiment of the step of FIG. 4. Layer 12 is deposited after deposition of metal 6. This deposition of metal 6 can moreover be localized on nanowires 2 only, by electrodeposition or pulsed laser ablation.

In another alternative embodiment (not represented), deposition of layer 12 is preceded by deposition of an additional metal layer. This additional layer then participates in supporting metallic nanotubes 6, in association with polymer or ceramic layer 12.

Figure 7:
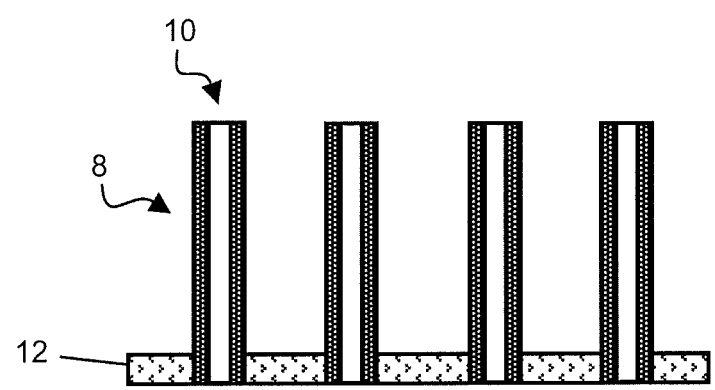
FIG. 7 represents a bed of metallic nanotubes obtained by the method of FIGS. 1 to 6.

In these embodiments, silicon nanowires 2 are preferably of identical dimensions and of the same orientation so as to form a homogenous assembly of nanotubes. The nanotubes are joined together either by growth support 4 (FIG. 3) or by layer 12 (FIG. 5-7). This assembly is generally called nanotube bed or nanotube array. This bed can be integrated in devices such as gas detectors, energy conversion and storage devices, particle filters and water purification membranes.

Unlike conventional techniques, this method enables formation of a plurality of nanotubes of controlled dimensions and distribution. This control is made possible by the formation of a template formed by nanowires made from sacrificial material. The distance between the nanotubes depends on the distance between the nanowires and on the thickness of the metallic layer. The inner diameter of the nanotubes is fixed by the diameter of the nanowires. The length of the nanotubes depends mainly on the length of the nanowires, and in the embodiment of FIGS. 4 and 5, on the thickness of layer 12.

FIG. 7 represents a bed of nanotubes 8 provided with a polymer layer 12. The nanotubes are preferably separated by a distance of more than 50 nm. The nanotubes are open on both sides following polishing of free ends 10 of nanotubes 8 and removal of the substrate. They then form circulation channels. They can for example be used for transportation of gas or fluid in a gas sensor or a particle filter.

Due to the mechanical properties of the polymers, the nanotube bed can be flexible. The thickness and arrangement of the polymer (or ceramic) layer 12 do indeed condition the rigidity of the bed. It is possible to vary the position of layer 12, for example by providing an additional sacrificial material on the substrate before deposition of the polymer or by etching the bottom part of this layer, after the substrate has been removed.

The bed of nanotubes represented in FIGS. 3, 5 to 7 is particularly well suited for applications requiring a large metallic surface, such as catalysts or electrochemical cells (fuel cells, metal-air batteries, etc.). The ratio of the metal surface over the volume is in fact high, which enhances the performances of these devices for a same quantity of metal.

Many variants and modifications of the method for producing metallic nanotubes described here will be apparent to the person skilled in the art. Although the method has been described in relation with silicon nanowires, other sacrificial materials can be used, in particular copper, zinc oxide (ZnO) or titanium oxide (TiO2) nanowires.

Nanotubes made from sacrificial material, for example from carbon, can also be envisaged as template instead of the nanowires, and more generally slender nanoelements with a large height over width ratio. A bed of metallized carbon nanotubes will then be obtained, i.e. metallic nanotubes concentric with the carbon nanotubes, before the carbon is eliminated. It can also be envisaged to eliminate the sacrificial material before the support.

We claim:

1. A method for producing an array of metallic nanotubes comprising the following steps:
   providing a first array of nanotubes or nanowires made from sacrificial material on a support;
   depositing a metal layer on the first array of nanotubes or nanowires so as to form a second array of metallic nanotubes concentric with the nanotubes or nanowires of the first array, wherein the metal layer is a member selected from the group consisting of platinum, gold, iridium, palladium, and alloys thereof;
   eliminating the sacrificial material;
   depositing a binding layer made from polymer material between the nanowires; and
   eliminating the support,
   wherein, once the support is eliminated, the binding layer is maintained and mechanically connects and supports the second array of metallic nanotubes.

2. The method according to claim 1, wherein the metal layer is a layer of platinum.

3. The method according to claim 1, wherein the metal layer is a layer of gold.

4. The method according to claim 1, wherein the metal layer is a layer of iridium.

5. The method according to claim 1, wherein the metal layer is a layer of palladium.

6. The method according to claim 1, wherein the polymer material is chosen from fluorinated polymers, perfluorinated polymers, perfluoro-sulfonated polymers and their copolymers.

7. The method according to 1, wherein the binding layer is deposited over a height lower than that of the nanowires.

8. The method according to claim 1, comprising, after the step of depositing the metal layer, a step of opening the metallic nanotubes at the free ends of the nanotubes.

9. The method according to claim 1, wherein the support and the sacrificial material are eliminated simultaneously after depositing the binding layer.

10. The method according to claim 1, wherein depositing the metal layer is performed by MOCVD.

11. The method according to claim 1, wherein the second array of metallic nanotubes is an array of nanotubes having two pass through opposite ends.

12. The method according to claim 1, wherein the second array of metallic nanotubes is an array of nanotubes having one pass through end and one end closed by metallic material of which the metal layer is formed.

13. The method according to claim 1, wherein the sacrificial material is eliminated before eliminating the support.

14. The method according to claim 1, wherein the sacrificial material is eliminated after eliminating the support.

15. The method according to claim 1, wherein the sacrificial material is eliminated before depositing the binding layer.

16. The method according to claim 1, wherein the binding layer is deposited before depositing the metal layer.

17. The method according to claim 1, wherein the binding layer is deposited after depositing the metal layer.

\* \* \* \* \*